United States Patent
Kurita et al.

[11] Patent Number: 5,977,685
[45] Date of Patent: Nov. 2, 1999

[54] POLYURETHANE ELASTOMER ACTUATOR

[75] Inventors: Yasushi Kurita; Tsutomu Ueda; Toshiaki Kasazaki, all of Yamatokohriyama; Toshihiro Hirai, 940-13, Suwagata, Ueda-shi, Nagano, all of Japan

[73] Assignees: Nitta Corporation; Toshihiro Hirai, both of Japan

[21] Appl. No.: 08/660,061

[22] Filed: Jun. 3, 1996

[30] Foreign Application Priority Data

Feb. 15, 1996 [JP] Japan ................................. 8-028120

[51] Int. Cl.$^6$ ...................................................... H04R 17/00
[52] U.S. Cl. ............................ 310/311; 310/330; 310/332; 310/800
[58] Field of Search .......................... 360/104; 428/411.1, 428/423.1, 423.3, 425.9, 913; 200/181; 310/339, 800, 330, 332, 311

[56] References Cited

U.S. PATENT DOCUMENTS

| 3,772,537 | 11/1973 | Clifford et al. | 310/6 |
| 4,245,172 | 1/1981 | Shirley | 310/332 |
| 4,435,667 | 3/1984 | Kolm et al. | 310/800 |
| 4,868,447 | 9/1989 | Lee et al. | 310/332 |
| 5,231,326 | 7/1993 | Echols | 310/339 |
| 5,376,857 | 12/1994 | Takeuchi et al. | 310/328 |
| 5,610,795 | 3/1997 | Snelling | 310/339 |

OTHER PUBLICATIONS

07–240544, Polyurethane Elastomer Actuator; Kasazaki et al.,Patent Abstracts of Japan, Sep. 1995.
06–85339, Polyurethane Elastomer Actuator; Hirai et al., Patent Abstracts of Japan, Mar. 1994.

*Primary Examiner*—Deborah Jones
*Assistant Examiner*—Cathy F. Lam
*Attorney, Agent, or Firm*—Morrison Law Firm

[57] ABSTRACT

A polyurethane elastomer actuator comprising a polyurethane elastomer 1 capable of deforming due to the orientation by an electric field, wherein the shrinkage displacement occurring at the time of the application of an electric field is transformed into other displacement. This polyurethane elastomer actuator does not require electrolyte and high voltage. Since it is not accompanied by chemical reactions and heat generation, its durability hardly deteriorates. This actuator deforms largely during driving.

14 Claims, 9 Drawing Sheets

POLYURETHANE ELASTOMER ACTUATOR

BACKGROUND OF THE INVENTION AND DESCRIPTION OF THE PRIOR ART

The present invention relates to a polyurethane elastomer actuator for transforming the shrinkage displacement occurring at the time of the application of an electric field into the curvature displacement or the elongation displacement.

Hitherto, a polymer gel actuator using a chargeable gel and an electrochemomechanical actuator using a conductive polymer are known for the advantage of the large deformation in a relatively low electric field. Both, however, require the use in electrolyte, and are accompanied by chemical reactions, including the ionic polarization and the oxidation and reduction, resulting in the poor durability due to heat generated by a current and electrolysis.

Piezoelectric materials including ceramics or polymer materials have been researched and developed for the application to speaker or headphone materials, and actuator elements of sensors, ultrasonic motors or the like. Such materials exhibit excellent performances in specific applications. However, when such materials are applied to an actuator, a high voltage of 10 kV is usually required for driving. Additionally, the amount of the deformation of the actuator is about several micrometers, which gives rise to necessity of a mechanism for magnifying the displacement. Even by forming the actuator into a multilayer structure, such as bimorph type, the obtained displacement amount is not so large, actually about hundreds of micrometers.

OBJECT AND SUMMARY OF THE INVENTION

It is hence an object of the invention to present an actuator wherein: electrolyte is not required for the use; not very high voltage is required; its durability hardly deteriorates; electrolysis or heat generation hardly occurs; and the deformation amount of the polyurethane elastomer is large at the time of driving.

The polyurethane elastomer actuator of the present invention comprises a polyurethane elastomer capable of deforming due to the orientation by an electric field, and transforms the shrinkage displacement, which occurs at the time of the application of an electric field, into other displacements.

The shrinkage of the polyurethane elastomer by the electric field orientation requires the application of a direct-current electric field or an alternating-current electric field. The necessary voltage therefor is not so high as for the displacement of the conventional piezoelectric material, such as piezoelectric ceramics or polymer piezoelectric material containing fluorine. In addition, the obtained displacement during driving is large, and the durability of the elastomer hardly deteriorates since electrolysis or heat generation hardly occurs due to no chemical reactions at the time of the shrinkage of the polyurethane elastomer by the application of an electric field.

The shrinkage displacement occurring at the time of the application of an electric field can be transformed into, for example, the curvature displacement or the elongation displacement.

Two electrode layers being different in thickness may be formed on both sides of the polyurethane elastomer, so that the rigidity pitch surface of the whole layer is slightly deviated from the center surface in the thickness direction, resulting in the occurrence of the curvature displacement.

Two electrode layers are formed on both sides of the polyurethane elastomer. On one side of the elastomer, the restraint of the deformation of the elastomer due to the electrode layer may be released intermittently, resulting in the occurrence of the curvature displacement.

Moreover, electrode layers are formed on both sides of the polyurethane elastomer, and the restraint of the deformation of the elastomer in the elongation direction due to both electrode layers is released intermittently, so that the elongation displacement may occur.

The polyurethane elastomer of the invention may contain a dielectric polyol that can be oriented by an electric field, and the dielectric polyol may have a substituent having dipolar moment.

Providing the polyurethane elastomer with an elastic restitutive layer causes the elastomer to reform into the original shape when releasing the application of an electric field. Forming the polyurethane elastomer into bimorph type may provide larger displacement amount.

Furthermore, laminating the polyurethane elastomer in the direction of the electric field may provide the increase of the amount and power of the deformation, resulting in larger displacement amount.

DETAILED DESCRIPTION OF THE INVENTION

Figure 1:
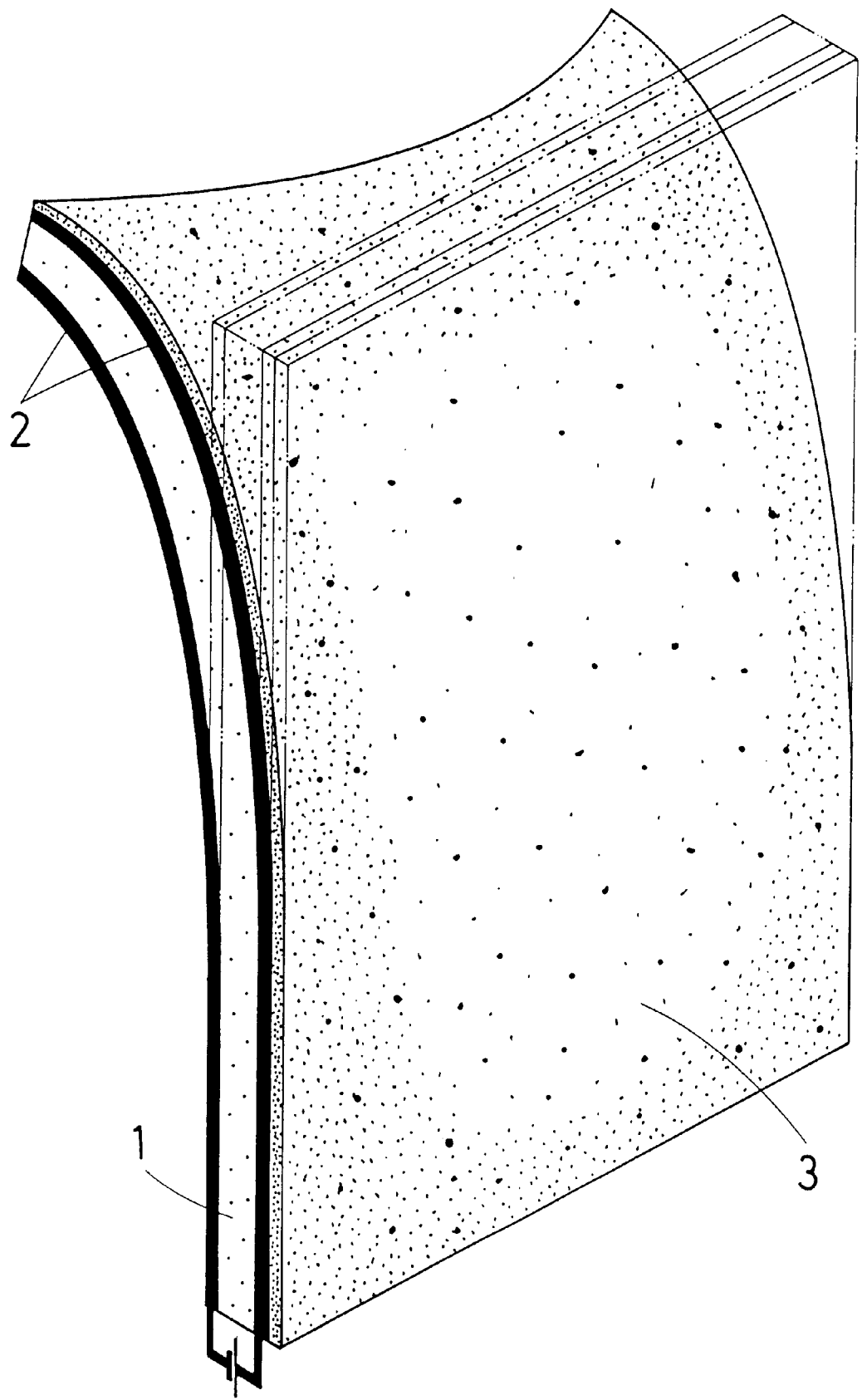
FIG. 1 is a perspective view of a first embodiment of a polyurethane elastomer actuator of the present invention.

The construction of the present invention is described in detail below.

In this embodiment, the shrinkage displacement of the polyurethane elastomer by the electric field orientation is considered to result from: the orientation in the electric field of a dielectric polyol or a polyol having a relatively strong dipolar moment; and thereby inducing changes of the conformation of the polymer chain. Therefore, one of the factors to influence the shrinkage displacement is the higher structure of the polyurethane elastomer such as the anisotropy of the polymer chains of the polyurethane elastomer in the aggregate state.

As compared with the material which is accompanied by chemical reactions, such as the conventional chargeable gel, the response of the polyurethane elastomer is extremely quick. The response speed of the polyurethane elastomer depends on its inductivity and the like, but it is generally from several milliseconds to tens of milliseconds. The amount of the deformation of the polyurethane elastomer is greatly influenced by the structure and properties depending on the bridging degree, which is characteristic of polyurethane elastomer.

The chemical structure of the polyurethane elastomer was further investigated to utilize its elastic function for an actuator. The structural essential components of the polyurethane elastomer are components of the soft segment, components of the hard segment, and hardener which is necessary for modifying the physical strength. The driving performances by an electric field were studied concerning various related compounds and combinations thereof.

The polyurethane elastomer can be obtained in the following method. Macromolecule polyol, organic polyisocyanate and a chain expander react by the use of a conventional method. For example, in a method, polyol having macromolecule and organic polyisocyanate react to produce urethane prepolymer, and thus urethane prepolymer reacts with a chain expander. In another method known as one-shot method, those three components react at the same time by a fixed ratio. The molar ratio of NCO of polyisocyanate to OH of polyol is preferably in a range of 1.5 to 9.

The polyisocyanate includes two or more isocyanate groups in one unit of its molecular chain, for example, trimethylene diisocyanate, tetramethylene diisocyanate, pentamethylene diisocyanate, hexamethylene diisocyanate, 2,4,4-trimethyl hexamethylene diisocyanate, 2,2,4-trimethyl hexamethylene diisocyanate, dodecamethylene diisocyanate, 1,3-cyclopentane diisocyanate, 1,3-cyclohexane diisocyanate, 1,4-cyclohexane diisocyanate, 4,4'-methylenebis(cyclohexyl isocyanate), 1-methyl-2,4-cyclohexane diisocyanate, 1-methyl-2,6-cyclohexane diisocyanate, 1,3-bis (isocyanatomethyl)cyclohexane, 1,4-bis(isocyanatomethyl) cyclohexane, m-phenylene diisocyanate, p-phenylene diisocyanate, 1,5-naphthalene diisocyanate, 4,4'-diphenylmethane diisocyanate, 2,4-tolylene diisocyanate, 2,6-tolylene diisocyanate, 4,4'-toluidine diisocyanate, dianidine diisocyanate, 4,4'-diphenyl ether diisocyanate, 1, 3-xylylene diisocyanate, ω, ω'-diisocyanato-1,4-diethylbenzene, polymethylene polyphenyl polyisocyanate, and isocyanurate modified compounds, carbodiimide modified compounds and biuret modified compounds of the above polyisocyanates. They may be used either alone or in a combination of two or more kinds.

The polyol includes one kind or more kinds of polyester polyol, polyether polyol, polycarbonate polyol and polybutadiene polyol. The polyol may be properly blended with polyolefin polyol.

The polyester polyol may include a condensate of polycarboxylic acid and low molecular polyol, having molecular weight of 500 to 10000. For example, poly(ethylene adipate) (PEA), poly(diethylene adipate) (PDA), poly(propylene adipate) (PPA), poly(tetramethylene adipate) (PBA), poly (hexamethylene adipate) (PHA), poly(neopentylene adipate) (PNA), polyol composed of 3-methyl-1,5-pentanediol and adipic acid, random copolymer of PEA and PDA, random copolymer of PEA and PPA, random copolymer of PEA and PBA, random copolymer of PHA and PNA, caprolactone polyol obtained by the ring-opening polymerization of ε-caprolactone, and polyol obtained by opening the ring of β-methyl-δ-valerolactone with ethylene glycol, can be used either alone or in a combination thereof. Preferably, those polyol have molecular weight of 500 to 10000. Besides, the polyester polyol may be composed of a copolymer of at least one of the following acids and at least one of the following glycols.

Acid: Terephthalic acid, isophthalic acid, phthalic anhydride, succinic acid, adipic acid, azelaic acid, sebacic acid, dodecanedioic acid, dimer acid (a mixture), ρ-hydroxybenzoate, trimellitic anhydride, ε-caprolactone, and β-methyl-δ-valerolactone.

Glycol: Ethylene glycol, propylene glycol, 1,4-butanediol, 1,5-pentanediol, 1,6-hexanediol, neopentylglycol, polyethylene glycol, polytetramethylene glycol, 1,4-cyclohexane dimethanol, pentaerythritol, and 3-methyl-1,5-pentanediol.

The polyether polyol may be manufactured by the ring-opening addition polymerization of an alkylene oxide (e.g. ethylene oxide and propylene oxide) with an initiator of a polyhydric alcohol (e.g. diethylene glycol), which is an active hydride. Specifically, polypropylene glycol (PPG), polyethylene glycol (PEG) or propylene oxide-ethylene oxide copolymer may be obtained. Or the polyether polyol may be obtained by cationic polymerization of tetrahydrofuran to have molecular weight of 500 to 5000. Specifically, polytetramethylene ether glycol (PTMG) may be obtained. Tetrahydrofuran may form a copolymer with other alkylene oxide. Specifically, tetrahydrofuran-propylene oxide copolymer or tetrahydrofuran-ethylene oxide copolymer may be formed. The above polyols are preferred to have molecular weight of 500 to 10000 and may be used either alone or in a combination.

The polycarbonate polyol is obtained by the condensation of a known polyol (polyhydric alcohol) with phosgene, chloroformic acid ester, dialkyl carbonate or diallyl carbonate. It varies in molecular weight. Particularly preferred polycarbonate polyol contains a polyol component using 1,6-hexanediol, 1,4-butanediol, 1,3-butanediol, neopentylglycol or 1,5-pentanediol. They have the molecular weight in a range of about 500 to 10000, and can be used either alone or in a combination.

The polybutadiene polyol includes the following. The liquid diene polymer containing hydroxyl groups has 600 to 3000 of molecular weight and 1.7 to 3.0 of average number of functional groups, and may be composed of diene polymer or diene copolymer, having 4 to 12 carbon atoms, or a copolymer of such diene monomer with addition polymerizable α-olefin monomer, having 2 to 2.2 carbon atoms. Specific examples are butadiene homopolymer, isoprene homopolymer, butadiene-styrene copolymer, butadiene-isoprene copolymer, butadiene-acrylonitrile copolymer, butadiene-2-ethyl hexyl acrylate copolymer, and butadiene-n-octadecyl acrylate copolymer. These liquid diene polymers can be obtained, for example, by heating a conjugated diene monomer with the presence of hydrogen peroxide in a liquid reactant.

The polyol component may be blended with polyolefin polyol obtained by saturating the double bonds of the above liquid diene polymer.

The hardener may be any material generally used for hardening urethane prepolymer to produce polyurethane elastomer. Examples are a polyol compound and a polyamine compound. As to the polyol compound, any of a primary polyol, a secondary polyol and a tertiary polyol may be used. Specific examples of one unit of the polymer chains are trimethylolpropane (TMP), ethylene glycol, 1,3-propanediol, 1,4-butanediol, 1,5-pentanediol, 1,6- hexanediol, propylene glycol, dipropylene glycol, 1,2-butanediol, 1,3-butanediol, 2,3-butanediol, 1,2-pentanediol, 2,3-pentanediol, 2,5-hexanediol, 2,4-hexanediol, 2-ethyl-1, 3-hexanediol, cyclohexanediol, and 2-ethyl-2-(hydroxymethyl)-1,3-propanediol. As to the polyamine compound, any of a primary amine, a secondary amine and a tertiary amine, such as diamine, triamine and tetramine, may be used. Examples include: an aliphatic amine such as hexamethylenediamine; an alicyclic amine such as 3,3'-dimethyl-4,4'-diaminodicyclohexyl methane; an aromatic amine such as 4,4'-methylene bis-2-chloroaniline, 2,2',3,3'-tetrachloro-4,4'-diaminophenyl methane or 4,4'-diaminodiphenyl; and 2,4,6-tris(dimethylaminomethyl) phenol. These hardeners may be used either alone or in a combination.

The obtained urethane prepolymer as described above may be hardened by mixing with the above hardener with the use of a conventional method including the known mixing ratio of the hardener to the urethane prepolymer, the known hardening temperature and the known hardening time.

The polyurethane elastomer of this embodiment may contain additives. The additive may be, for example, a nonionic plasticizer, a fire retardant, a filler, a stabilizer or a coloring agent.

The plasticizer includes dioctyl phthalate (DOP), dibutyl phthalate (DBP), dioctyl adipate (DOA), triethylene glycol dibenzoate, tricresyl phosphate, dioctyl phthalate, aliphatic ester of pentaerythritol, dioctyl sebacate, diisooctyl azelate, and dibutoxy ethoxyethyl adipate.

The manufacturing method of the polyurethane elastomer actuator of the present invention is described below.

A variety of combinations of the above compositions provides various kinds of polyurethane elastomers. The polyurethane elastomer is formed into a film or a sheet of 0.01 to 1 mm in thickness, and a mold release agent is removed therefrom. As to a method of removing the mold release agent from the formed polyurethane elastomer, a wet washing method is sufficient, but a method of removing impurities including the mold release agent by using ions, ozone, electrons or ultraviolet rays, such as a plasma processing method using glow discharge and a corona discharge processing method, is preferred for the surface modification of the elastomer, on which electrodes are provided.

As the material of the electrode to shrink the polyurethane elastomer due to the orientation by an electric field, the following may be employed: gold, platinum, aluminum, metal indium, indium oxide, stannic oxide, ITO, silver, other metals and alloys, polyaniline, elastomer rubber, other conductive resins, or carbon. A conductive resin in which gold or platinum is dispersed or a conductive elastomer may be also used. The electrode may be formed by using an ion plating method, a plasma CVD method, an ion sputter coating method, a vacuum vapor deposition method, a screen printing, an ion beam assisting method, an ionizing vapor deposition method or the like.

The rigidity and elasticity of the electrode itself are preferred to be of a level not to affect the properties of the polyurethane elastomer. The thickness of the electrode provided on the polyurethane elastomer varies with the electrode material, type of urethane elastomer or the thickness of polyurethane elastomer film, but preferably it should be about 0.05 to 10 $\mu$m.

The electrode may function as means for the elastic restitution. Providing the different electrodes in thickness causes the deviation of the pitch line. That is, since the flexure displacement or the curvature displacement occurs when the rigidity pitch line in the thickness direction of the polyurethane elastomer is deviated slightly from the thickness center, the thickness of both electrodes are adjusted. Besides, the pitch line may be deviated by coating or sheeting the surface of one electrode with some elastomer material. This elastomer material should be preferably excellent in insulation and low in dielectric constant.

By laminating the polyurethane elastomer actuator, the driving force at the time of the deformation increases depending on the number of lamination layers. Preferably, the elastomer material, which functions as an adhesive agent or an adhesion layer when laminating, should be thermoplastic.

The elastic restitutive layer may be composed of polyurethane, polyester, polyamide, acrylonitrile, butyl rubber, coumaro-indene resin, epoxy resin, cyclorubber, chloroprene rubber, polyvinyl acetate, polyvinyl chloride, polyvinylidene chloride, silicone, styrene rubber, vinyl chloride copolymer resin, or polyvinyl acetal. It may be either a solid matter or a solution such as solvent or water dispersive agent. A solvent or an emulsion is preferred for forming a thin layer.

The thickness of the elastic restitutive layer formed on the polyurethane elastomer varies with kind of the material, type of urethane elastomer or film thickness of the polyurethane elastomer, but it should be preferably about 0.1 to 20 $\mu$m, about 0.1 to 100% of the thickness of the whole layer.

In the polyurethane elastomer actuator of the present invention, the curvature displacement or the shrinkage displacement occur continuously and linearly due to the electric field, and the obtained force and deformation are controlled linearly by electric field. The shrinkage displacement of the polyurethane elastomer reaches several percents at maximum, which requires a certain high density of the electric field . In order to provide a necessary density of the electric field without raising the supplied voltage from a power source, the thickness of the polyurethane elastomer is preferably formed to be between 0.01 and 1 mm.

PREFERRED EMBODIMENTS OF THE INVENTION

The invention is more specifically described below with the references of the preferred embodiments shown in the drawings.

Embodiment 1

(1) 10.8 by weight of paraphenylene diisocyanate (PPDI, trade name Hylene manufactured by Du Pont Company) was added to 100 by weight of poly-3 methyl-1,5-pentane adipate polyol (trade name Kurapol P3010 manufactured by Kuraray K.K.) which has 2945 of an average molecular weight. The reaction was conducted for 2 hours at 85° C. in nitrogen-containing air current. Urethane prepolymer having endisocyanate group was obtained.

100 by weight of thus urethane prepolymer was fused and mixed with 1.0 by weight of 1,2-propanediol (manufactured by Kanto Chemical K.K) and 1.4 by weight of trimethylol propane (manufactured by Kanto Chemical K.K). The obtained mixture was poured into a die having thickness of 0.2 mm, preliminarily heated at 110° C., and kept in an oven for 16 hours at 110° C. to complete the hardening reaction. Thus polyurethane elastomer having thickness of 2 mm showed 3% of the displacement at maximum when 1 kV was applied.

(2) As shown in FIG. 1, electrode layers 2 composed of gold (about 0.1 to 0.5 microns in thickness) were vapor-deposited on both sides of a sheet of polyurethane elastomer 1 obtained in (1) (about 200µ in thickness) by using an ion sputtering method. The water-based urethane resin (trade name HYDRAN HW-350 manufactured by Dainippon Ink K.K.) (about 10 to 50 microns in thickness) was further coated on one gold electrode layer 2. Then, by heating for about 3 minutes at 80 to 100° C., an elastic layer was obtained. This water-based urethane resin layer functions as an elastic restitutive layer 3 to reform the whole layer into the original shape when the application of electric field is released.

Thus obtained polyurethane elastomer actuator measured 20 mm×50 mm. In the diagram, the solid line shows the shape of the actuator in the state of no application of an electric field, and the double dot chain line shows the shape in the state of application of an electric field.

The lower end of thus formed polyurethane elastomer actuator was fixed, and a voltage of 100 to 1000 V was applied to both electrodes. The actuator was initially curved by its own weight, but was then deformed in the vertical direction.

Figure 2:
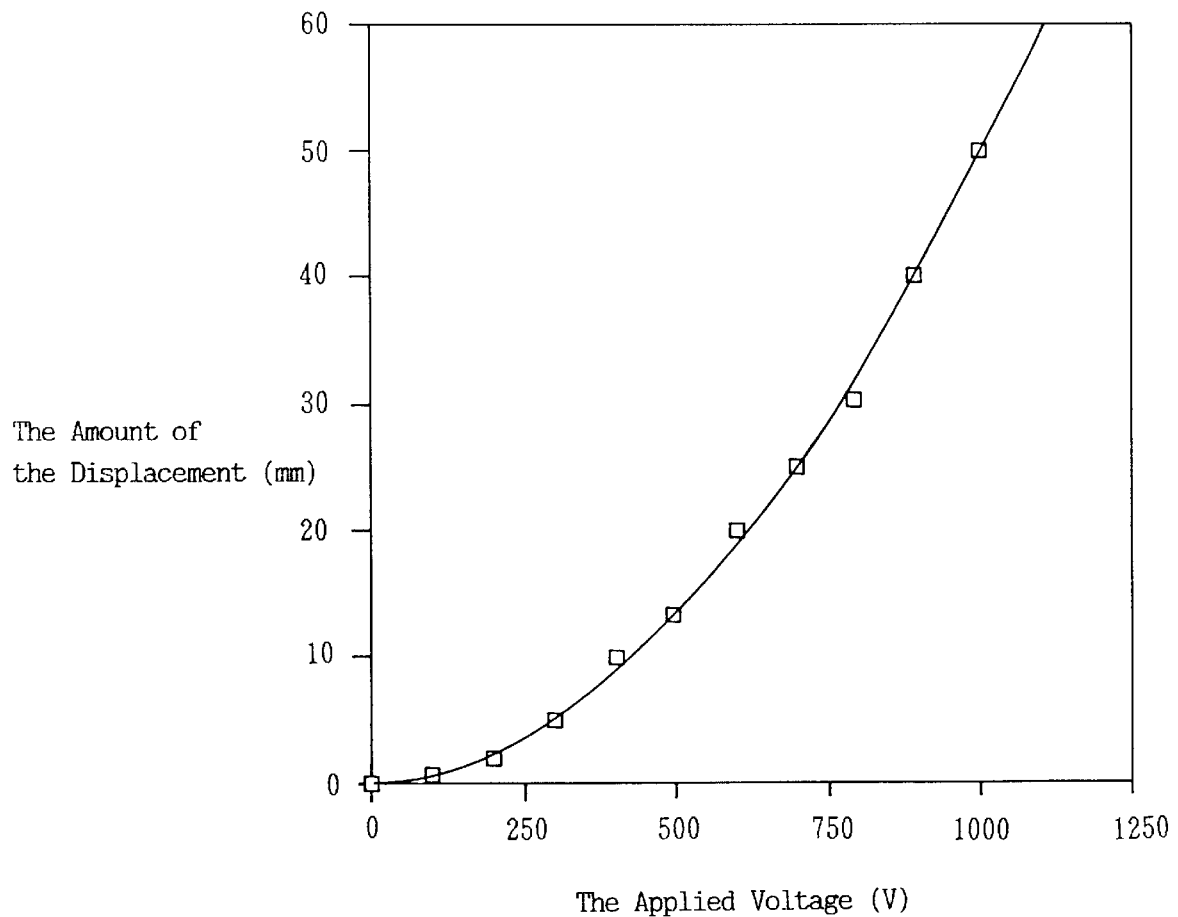
FIG. 2 is a graph showing the amount of the displacement of the polyurethane elastomer actuator (mm) as a function of the applied voltage (V).

FIG. 2 shows a graph showing the relation between applied voltage (V) and displacement (mm). The maximum displaced distance of the top end of the actuator was about 50 mm with an application of a voltage of 1000 V. The angle of its deformation was about 90 degrees. It took about 0.5 second from the application of an electric field until the completion of the transformation of the actuator. When the application of an electric field was released, the actuator was promptly restored to its original shape.

The measured current flowing during the application of a voltage was several microamperes or less, and the energy loss or the deterioration of the actuator due to the heat generation hardly occurred. By periodically converting the polarity of the electric field, the curvature and elongation motions can be repeated not only in one direction but also in both directions. Or by forming the actuator into a laminate structure such as bimorph type, the displacement amount may be further increased.

In the polyurethane elastomer actuator of this embodiment, when applying a direct-current electric field or an alternating-current electric field, the shrinkage displacement in the thickness direction of the polyurethane elastomer 1 can be transformed into the curvature (or elongation) displacement. Therefore, the polyurethane elastomer actuator is usable as a driving source and can be applied to various actuators in which optional control is possible.

Embodiment 2

Figure 3:
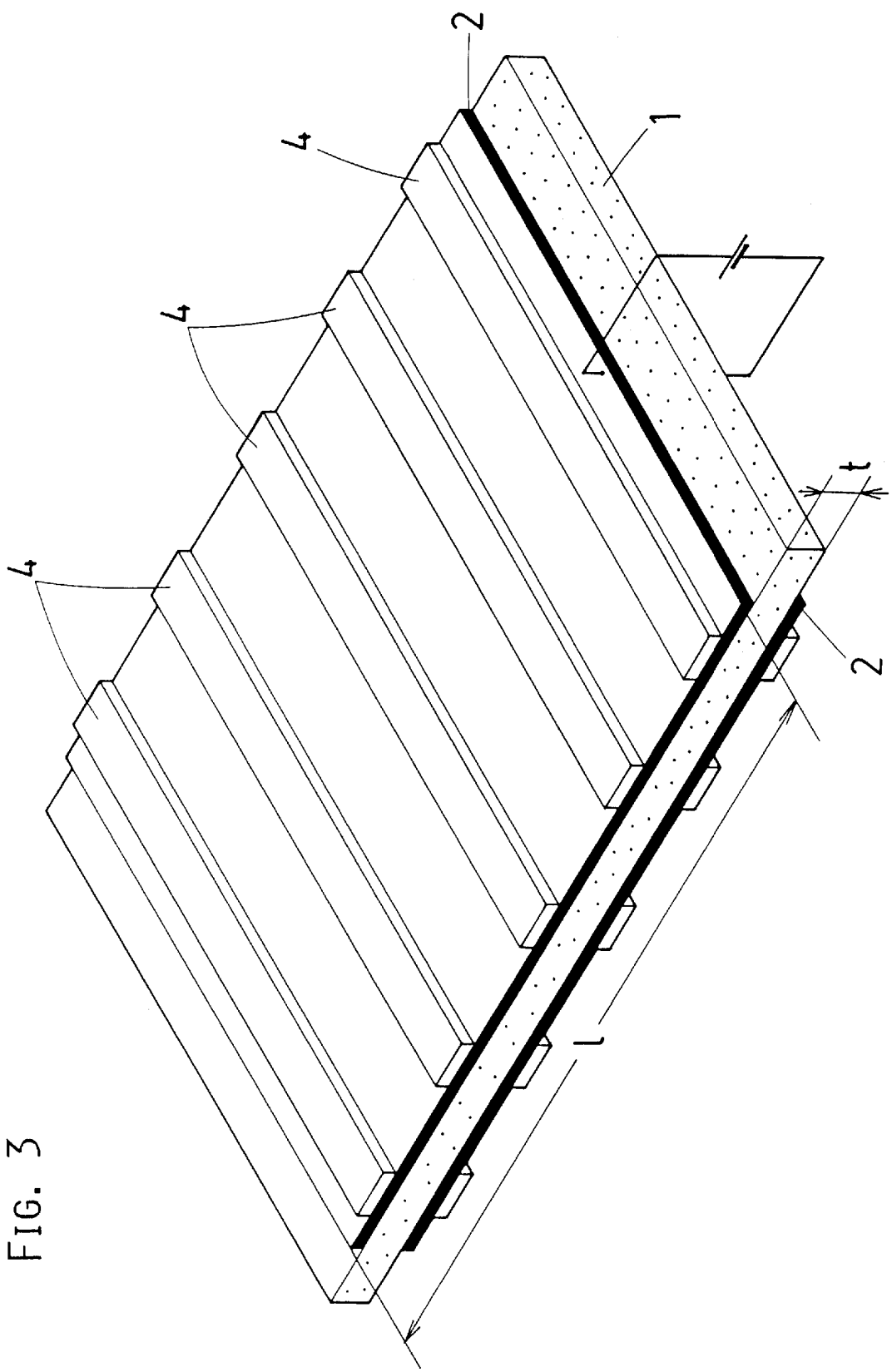
FIG. 3 is a perspective view of a second embodiment of a polyurethane elastomer actuator of the present invention.

As shown in FIG. 3, a plurality of bars 4 were fixed on both outsides of a pair of gold electrodes 2, which were vapor-deposited on both sides of the polyurethane elastomer 1, to prevent the displacement in the width direction of the polyurethane elastomer 1 and provide the displacement only in the length direction. That is, the shrinkage displacement in the thickness direction of the polyurethane elastomer 1 was mainly transformed into the displacement only in the length direction. Instead of the bars 4, it may be also possible to use anisotropic materials, which are easily stretchable in the length direction (flexible resin) or less stretchable in the width direction, such as woven fabric or canvas.

In this polyurethane elastomer actuator, when the thickness of the polyurethane elastomer 1 was compressed by 1% in the direction of the electric field, the elastomer elongated a maximum of 1% in the length direction. The elongation displacement is magnified depending on the ratio of thickness (t) and length (l) of the polyurethane elastomer 1. The elongation displacement is expressed as (l/t) x the compressed distortion rate, in which the (l/t) is the magnification rate. When the polyurethane elastomer 1 shrinks in the direction of the thickness (t), it is magnified in the direction of the length (l) depending on the Poisson's ratio of the material. Therefore, the displacement itself can be utilized as the magnifying mechanism.

Embodiment 3

Figure 4:
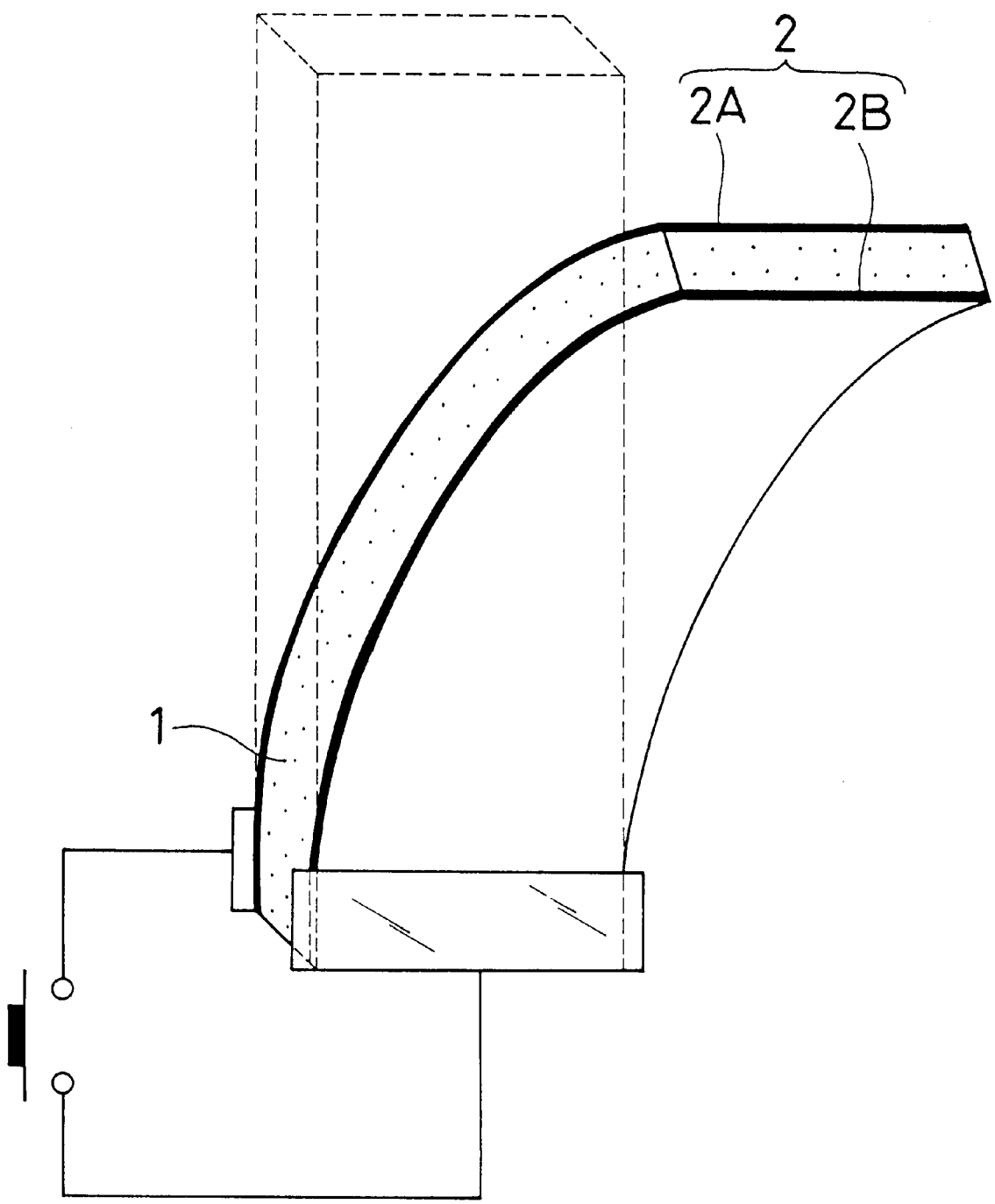
FIG. 4 is a perspective view of a third embodiment of a polyurethane elastomer actuator of the present invention.

Another embodiment of the invention is shown in FIG. 4. Electrode layers 2 being different in thickness were formed on both sides of the polyurethane elastomer 1, so that the rigidity pitch line of the elastomer in the thickness direction was slightly deviated from the center line in the thickness direction, resulting in the occurrence of the curvature displacement.

Electrode layer 2A composed of aluminum (about 0.1 micron in thickness) was vapor-deposited on one side of a sheet of the polyurethane elastomer 1 (about 200µ in thickness) obtained in (1) of the embodiment 1 by using an ion sputtering method. Electrode layer 2B composed of aluminum (about 0.3 micron in thickness) was vapor-deposited on the other side by an ion sputtering method. Thus obtained polyurethane elastomer actuator measured 60 mm×20 mm. In the diagram, the solid line shows the shape of the actuator in the state of application of an electric field, and the dashed line denotes the shape in the state of no application of an electric field.

The lower end of thus formed polyurethane elastomer actuator was fixed, and a voltage of 100 to 1000 V was applied to both electrodes. As a result, the shrinkage displacement of the elastomer in the thickness direction occurred while the displacement in a direction to expand the surface area of the elastomer occurred in order to maintain its original volume. Since the electrode layer 2B on the polyurethane elastomer 1 was formed thicker than the electrode layer 2A to restrain the displacement of the polyurethane elastomer 1 more strongly, the displacement is larger at the side on which the electrode layer 2A was vapor-deposited. That is, the displacement to expand the surface, on which the electrode layer 2A was deposited, occurred. As a result, the initially standing polyurethane elastomer 1 was curved to the front side in the diagram. The maximum displaced distance of the top end of the elastomer was about 50 mm with a voltage of 1000 V.

Embodiment 4

Figure 5:
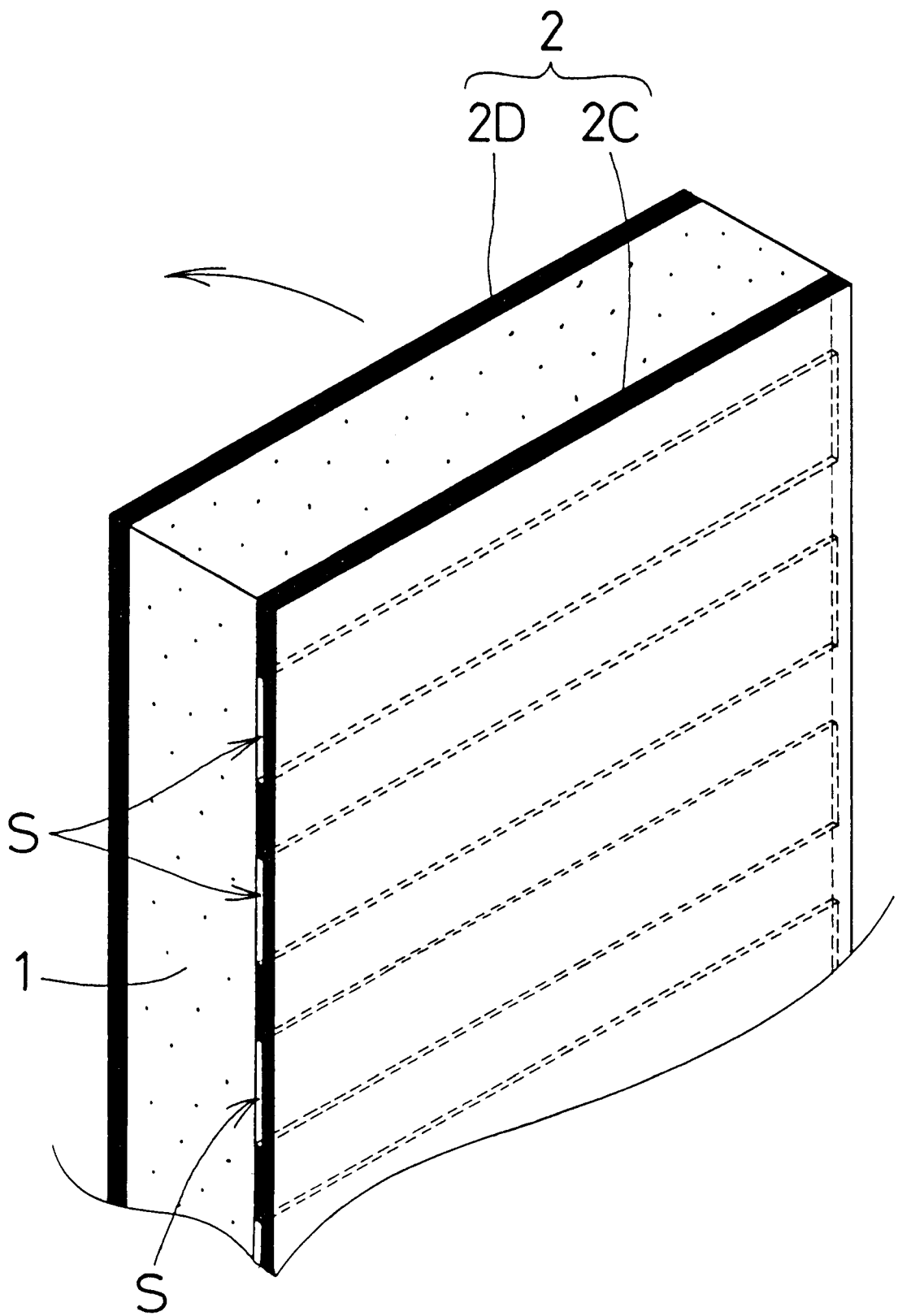
FIG. 5 is a partial perspective view of a fourth embodiment of a polyurethane elastomer actuator of the present invention.

As shown in FIG. 5, electrode layers were formed on both sides of the polyurethane elastomer, wherein the restraint of the displacement of the elastomer due to the electrode layer was intermittently released on one side of the elastomer, resulting in the occurrence of the curvature displacement.

Several lines of an insulating liquid were applied only to one side of a sheet of the polyurethane elastomer 1 (about 200µ in thickness) obtained in (1) of the embodiment 1 in the horizontal direction (positions S in the diagram). Then, electrode layers 2 composed of gold (about 0.05 micron in thickness) were vapor-deposited on both sides of the elastomer by using an ion sputtering method, and thus obtained polyurethane elastomer actuator measured 20 mm×50 mm.

Therefore, slit gaps S were formed in the portions where the insulation liquid was applied in the horizontal direction on the electrode layer 2C, and thus the electrode surface did not contact with the polyurethane elastomer 1 at the portions of the slit gaps S.

The lower end of thus formed polyurethane elastomer actuator was fixed, and a voltage of 100 to 1000 V was applied to both electrodes. As a result, the shrinkage displacement of the elastomer in the thickness direction occurred while the displacement in a direction to expand the surface area of the elastomer occurred in order to maintain its original volume. On the side on which the electrode layer 2C having the slit gaps S was formed, the restraint of the displacement in the vertical direction due to the electrode layer 2C was intermittently released, and thus the larger displacement occurred than that on the other side coated with the electrode layer 2D. Therefore, the displacement to expand the surface on which the electrode layer 2C is formed occurred in the vertical direction, and finally the initially standing polyurethane elastomer 1 was curved in the direction of the arrow in the diagram. The maximum displaced distance of the top end was about 50 mm with the application of a voltage of 1000 V.

Preferably, the dielectric constant of the insulating liquid may be large and this insulating liquid may also function as a lubricating fluid. By partly masking the polyurethane elastomer 1 with the mold release agent or the like, non-contacting portions on the surface of the electrode with the polyurethane elastomer 1 can be formed.

Embodiment 5

Figure 6:
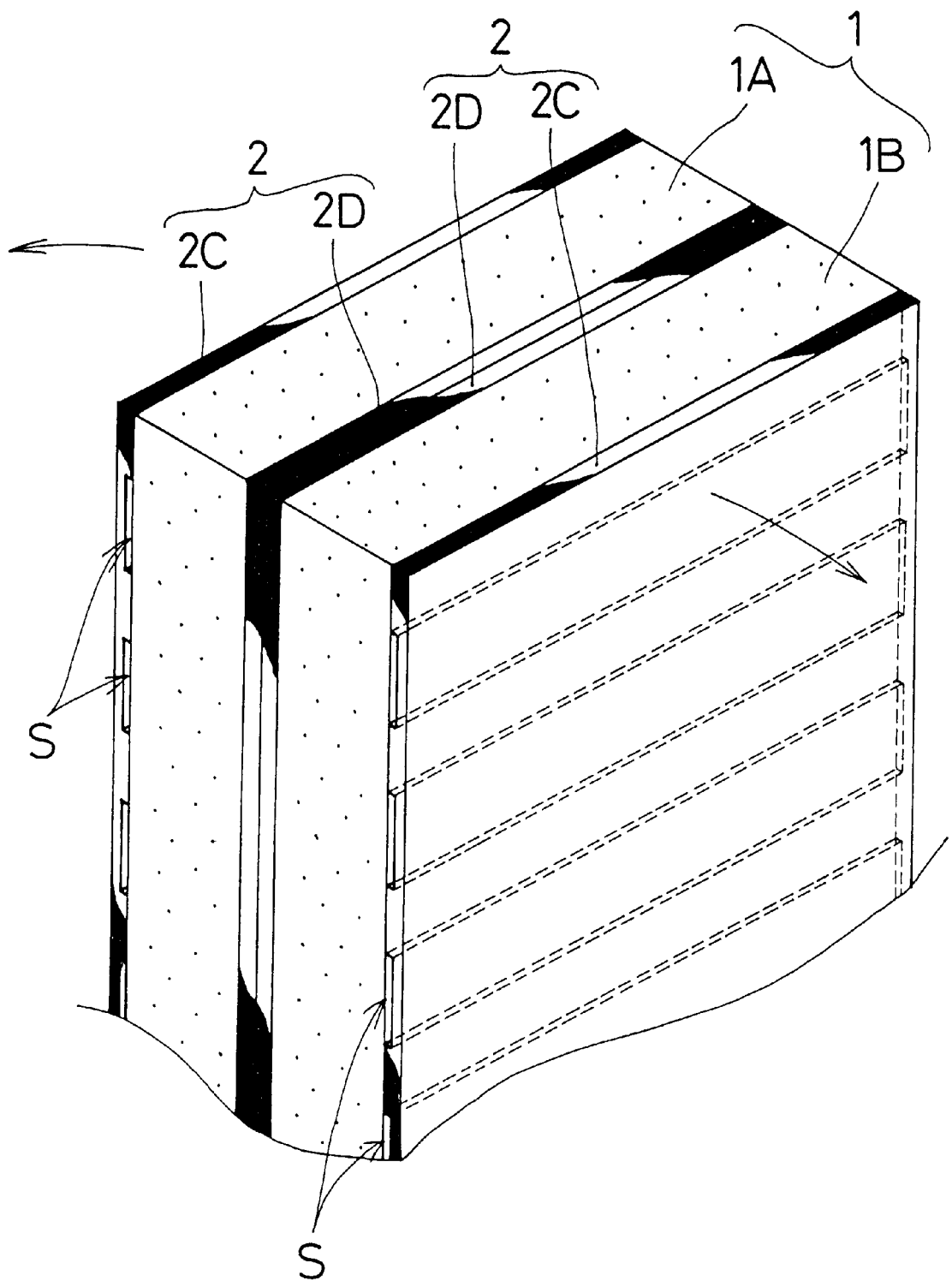
FIG. 6 is a partial perspective view of a fifth embodiment of a polyurethane elastomer actuator of the present invention.

As shown in FIG. 6, unimorph type of the polyurethane elastomer 1 in the embodiment 4 was modified into bimorph type by arranging face to face and adhering the surfaces of two polyurethane elastomers, to which the electrodes 2D were applied entirely.

When a voltage was applied to the polyurethane elastomer 1A, the whole elastomer bent in the direction of the front arrow in the diagram owing to the reason mentioned in the embodiment 4, and when a voltage was applied to the polyurethane elastomer 1B, the whole elastomer bent in the direction of the back arrow in the diagram.

Embodiment 6

Figure 7:
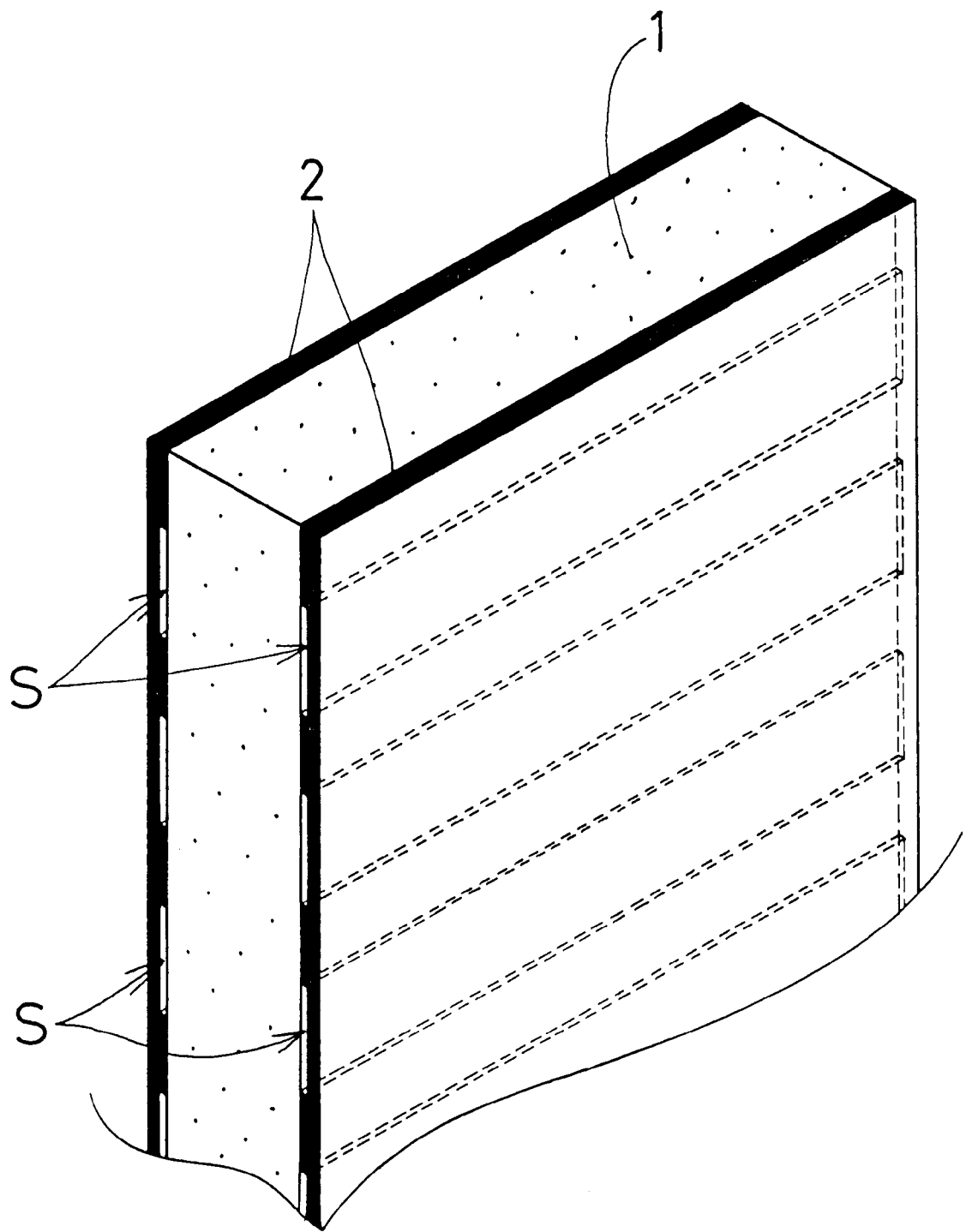
FIG. 7 is a partial perspective view of a sixth embodiment of a polyurethane elastomer actuator of the present invention.

As shown in FIG. 7, electrode layers were formed on both sides of the polyurethane elastomer, wherein the restraint of the displacement of the elastomer due to the electrode layers was intermittently released on both sides of the elastomer, resulting in the occurrence of the elongation displacement.

Several lines of an insulating liquid were applied in the horizontal direction (positions S in the diagram) to both sides of a sheet of the polyurethane elastomer 1 (about 200µ, in thickness) obtained in (1) of the embodiment 1. Then, electrode layers 2 composed of gold (about 0.1 micron in thickness) were vapor-deposited on both sides of the elastomer by using an ion sputtering method, and thus obtained polyurethane elastomer actuator measured 20 mm×50 mm.

Therefore, slit gaps S were formed in the portions where the insulation liquid was applied in the horizontal direction on both sides of the electrode layers 2, and thus the electrode surface did not contact with the polyurethane elastomer 1 at the portions of the slit gaps S.

The lower end of thus formed polyurethane elastomer actuator was fixed, and a voltage of 100 to 1000 V was applied to both electrodes. As a result, the shrinkage displacement of the elastomer in the thickness direction occurred while the displacement in a direction to expand the surface area of the elastomer occurred in order to maintain its original volume. Since the restraint of the displacement in the vertical direction is intermittently released due to the slit gaps S formed on the electrode layers 2, the polyurethane elastomer 1 can be deformed larger in the vertical direction than in the width direction in which the displacement is restrained depending on the modulus of elasticity of the electrode layers 2. That is, the polyurethane elastomer 1 elongates in the vertical direction by absorbing the displacement in the width direction. The expanded distance was about 50 mm with the application of a voltage of 1000 V.

Embodiment 7

Figure 8:
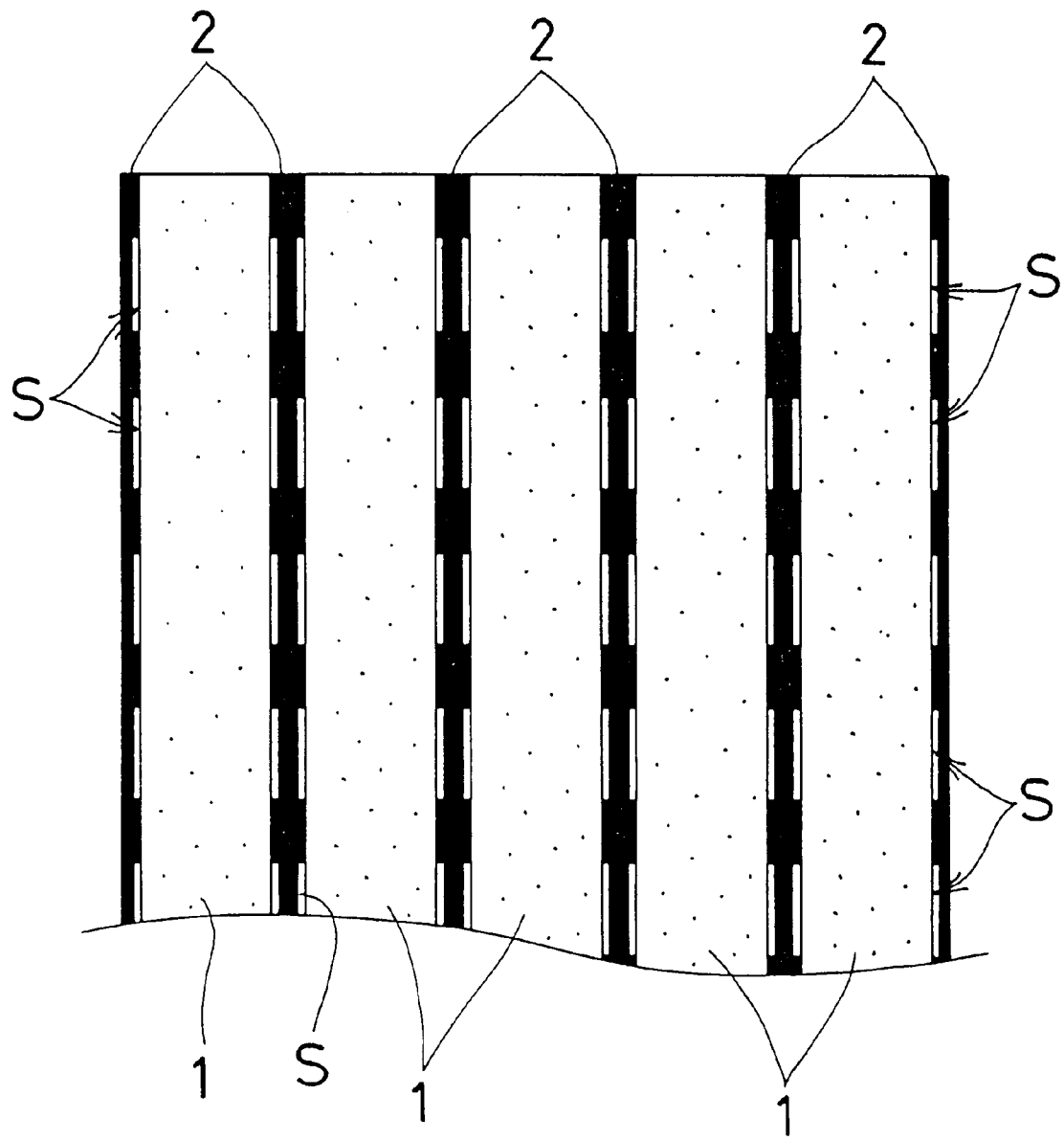
FIG. 8 is a partial perspective view of a seventh embodiment of a polyurethane elastomer actuator of the present invention.

As shown in FIG. 8, five layers of the polyurethane elastomer 1 in the embodiment 6 were laminated in the thickness direction and were adhered to fix them together. The amount and the force of the displacement were increased in proportion to the number of layers.

Embodiment 8

Figure 9:
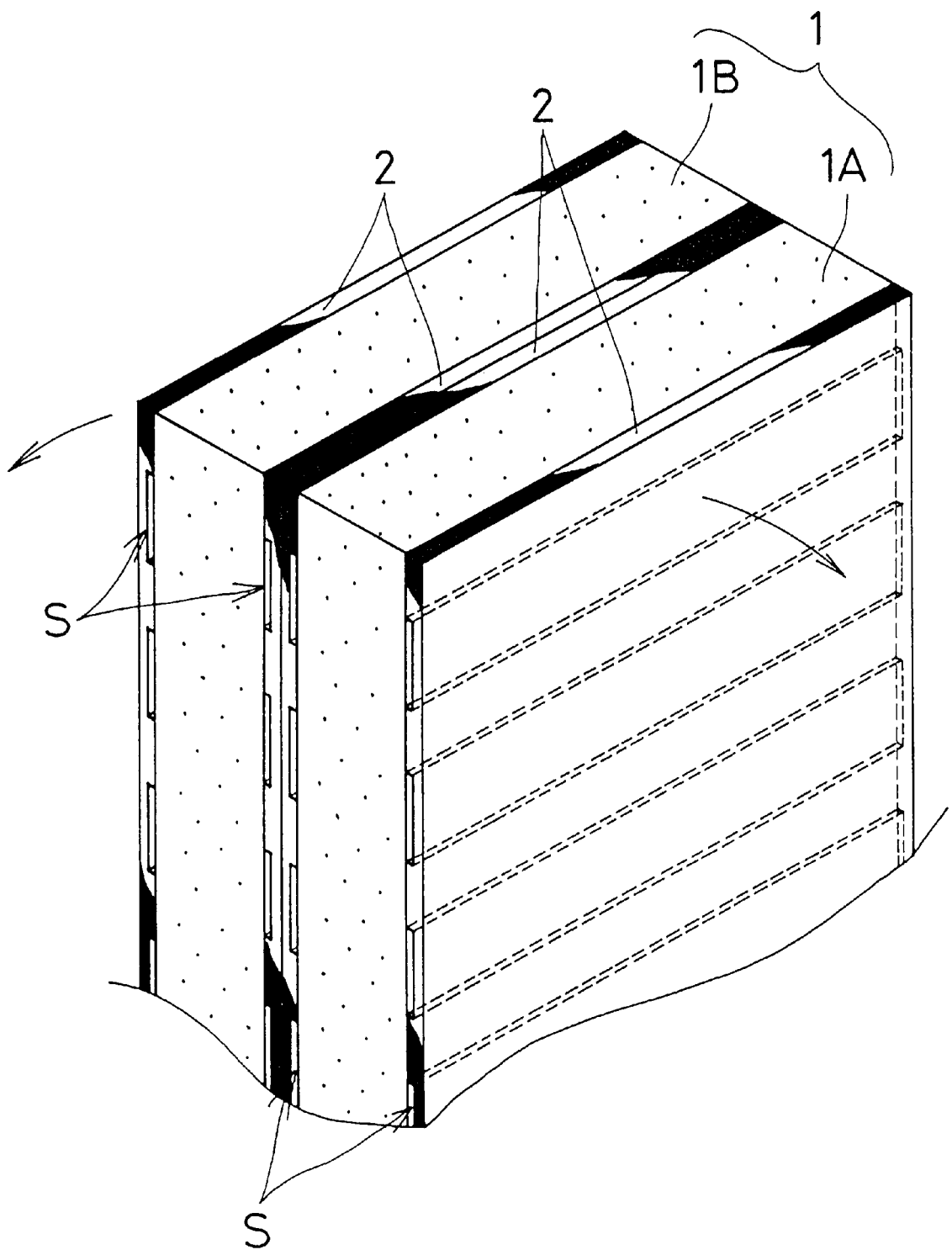
FIG. 9 is a partial perspective view of a eighth embodiment of a polyurethane elastomer actuator of the present invention.

As shown in FIG. 9, two polyurethane elastomers 1 as shown in the embodiment 6 were disposed side by side and adhered to be formed into bimorph type.

When a voltage was applied to the polyurethane elastomer 1A, the actuator as a whole bent in the direction of the back arrow in the diagram due to the restraint of the displacement of the polyurethane elastomer 1B. When a voltage was applied to the polyurethane elastomer 1B, the actuator as a whole bent in the direction of the front arrow in the diagram due to the restraint of the displacement of the polyurethane elastomer 1A.

In the view of the above, the polyurethane elastomer actuator of the present invention is expected to be applied to a piezoelectric or electrostrictive actuator, including optical control element (microangle adjustment device), mechanical control element (printer paper feed), artificial anus, artificial heart, and artificial finger.

In conclusion, the present invention can provide a polyurethane elastomer actuator comprising a polyurethane elastomer which: does not require electrolyte and very high voltage; is almost free from the deterioration of durability, electrolysis and heat generation; and deforms largely during driving.

What is claimed is:

1. A polyurethane elastomeric actuator comprising:
   a sheet of an elastomeric material;
   said elastomeric material being of a type which is displaced when an electric field is applied thereto, and returns toward its original dimension when said electric field is removed;
   first and second electrodes on opposed sides of said sheet;
   at least one of said first and second electrodes having a property which converts displacement of said elastomeric material into one of a curvature of said sheet and an elongation of said sheet.

2. A polyurethane elastomeric actuator according to claim 1, wherein said property includes a first thickness of said first electrode that is greater than a second thickness of said second electrode, whereby said first electrode restrains a lengthwise expansion of said actuator more than said second electrode, and thereby forces said sheet to curve toward said first electrode.

3. A polyurethane elastomeric actuator according to claim 1, further comprising an elastic restitutive layer on at least one of said first electrode and said second electrode, said elastic restitutive layer being effective for restoring said sheet toward its original position when said electric field is removed.

4. A polyurethane elastomeric actuator according to claim 1, wherein said property includes at least one transverse element affixed at least to said first electrode, said transverse element being effective to change an ability of said first electrode to be displaced in a longitudinal direction.

5. A polyurethane elastomeric actuator according to claim 4, wherein said at least one transverse element includes at least one bar affixed to an outer surface of said first electrode.

6. A polyurethane elastomeric actuator according to claim 4, wherein said at least one transverse element is between said first electrode and said actuator forming a transverse area between said first electrode and said sheet, said transverse area enabling greater lengthwise expansion on a side of said sheet occupied by said first electrode than a side of said sheet without said transverse element.

7. A polyurethane elastomeric actuator according to claim 4, wherein said property includes at least a second transverse element affixed to said second electrode, said at least a second transverse element being effective to change an ability of said second electrode to be displaced in a longitudinal direction.

8. A polyurethane elastomeric actuator according to claim 1, wherein said elastomer contains a dielectric polyol responsive to an electric field.

9. A polyurethane elastomeric actuator according to claim 8, wherein said dielectric polyol has a substituent having dipolar moment.

10. A polyurethane elastomeric actuator according to claim 1, further comprising:

a second sheet of elastomeric material;

said second sheet of elastomeric material being of a type which is displaced when an electric field is applied thereto and returns toward its original dimension when said electric field is removed;

third and fourth electrodes on opposed sides of said second sheet;

said third electrode being affixed to said first electrode, whereby a bimorph structure is created;

at least one of said third and fourth electrodes having a second property which converts displacement of said elastomeric material into one of a curvature and an elongation of said second sheet.

11. A polyurethane elastomeric actuator according to claim 10, wherein application of said electric field only between said first and second electrodes changes said curvature of said bimorph structure in a first direction, and application of electricity only between said third and fourth electrodes changes said curvature of said bimorph structure in a second, opposite, direction.

12. A polyurethane elastomeric actuator according to claim 10, wherein simultaneous application of said electricity between said first and second electrodes and said third and fourth electrodes elongates said bimorph structure.

13. A polyurethane elastomeric actuator according to claim 10, wherein said elastomer contains a dielectric polyol responsive to an electric field.

14. A polyurethane elastomeric actuator according to claim 13, wherein said dielectric polyol has a substituent having dipolar moment.

* * * * *